United States Patent
Woodley

(10) Patent No.: US 9,664,730 B2
(45) Date of Patent: *May 30, 2017

(54) SYSTEM FOR MEASURING SOFT STARTER CURRENT AND METHOD OF MAKING SAME

(71) Applicant: Eaton Corporation, Cleveland, OH (US)

(72) Inventor: Kaijam M. Woodley, Brown Deer, WI (US)

(73) Assignee: Eaton Corporation, Cleveland, OH (US)

( * ) Notice: Subject to any disclaimer, the term of this patent is extended or adjusted under 35 U.S.C. 154(b) by 216 days.

This patent is subject to a terminal disclaimer.

(21) Appl. No.: 14/551,727

(22) Filed: Nov. 24, 2014

(65) Prior Publication Data
US 2015/0077154 A1 Mar. 19, 2015

Related U.S. Application Data

(63) Continuation of application No. 13/535,522, filed on Jun. 28, 2012, now Pat. No. 8,896,334.

(51) Int. Cl.
| | |
|---|---|
| *G01R 31/10* | (2006.01) |
| *G01R 31/26* | (2014.01) |
| *H02P 1/42* | (2006.01) |
| *H03K 17/16* | (2006.01) |
| *H03K 17/725* | (2006.01) |
| *G01R 19/00* | (2006.01) |
| *G01R 31/34* | (2006.01) |

(52) U.S. Cl.
CPC ..... *G01R 31/2633* (2013.01); *G01R 19/0092* (2013.01); *G01R 31/263* (2013.01); *G01R 31/34* (2013.01); *H02P 1/423* (2013.01); *H03K 17/166* (2013.01); *H03K 17/725* (2013.01); *H03K 2217/0009* (2013.01); *Y10T 29/49002* (2015.01)

(58) Field of Classification Search
CPC .................................................... G01R 31/263
USPC ................................ 324/750.01, 115, 762.01
See application file for complete search history.

(56) References Cited

U.S. PATENT DOCUMENTS

| | | | |
|---|---|---|---|
| 4,056,776 | A | 11/1977 | Olsson et al. |
| 5,920,189 | A | 7/1999 | Fisher et al. |
| 6,051,893 | A | 4/2000 | Yamamoto et al. |
| 6,404,346 | B1 | 6/2002 | Jadric et al. |

(Continued)

FOREIGN PATENT DOCUMENTS

| | | |
|---|---|---|
| EP | 1100190 A2 | 5/2001 |
| JP | 60-174521 A | 9/1985 |

OTHER PUBLICATIONS

International Search Report and Written Opinion from corresponding PCT/US2013/046232, dated Oct. 24, 2013.

*Primary Examiner* — Reena Aurora
(74) *Attorney, Agent, or Firm* — Ziolkowski Patent Solutions Group, SC

(57) ABSTRACT

A system for measuring soft starter current includes a current monitoring system having a controller and a current transfer device that includes a first solid state switching device. A first current sensor is coupled to the first solid state switching device and the controller to sense off-state current of the first solid state switching device. The controller is configured to determine an operational status of the first solid state switching device.

20 Claims, 2 Drawing Sheets

(56) References Cited

U.S. PATENT DOCUMENTS

| | | | |
|---|---|---|---|
| 8,896,334 B2* | 11/2014 | Woodley | H03K 17/166 |
| | | | 324/115 |
| 9,063,178 B2* | 6/2015 | Woelfel | G01R 15/18 |
| 2009/0312970 A1* | 12/2009 | Kalenine | G01R 15/09 |
| | | | 702/64 |

* cited by examiner

SYSTEM FOR MEASURING SOFT STARTER CURRENT AND METHOD OF MAKING SAME

CROSS-REFERENCE TO RELATED APPLICATION

The present invention is a continuation of and claims the benefit of U.S. Ser. No. 13/535,522, filed on Jun. 28, 2012, the disclosure of which is incorporated herein by reference.

BACKGROUND OF THE INVENTION

Embodiments of the invention relate generally to alternating current (AC) motors and, more particularly, to a system and method for measuring current flowing through a motor soft starter.

Motor soft starters are devices that control transmission of voltage and current from an AC power source to an induction motor. Soft starters are configured to limit the transient voltages and current to the induction motor during start-up, resulting in a "soft" motor starting. In operation, power from the AC source is passed through switching devices in the soft starter, such as a pair of anti-parallel solid-state switches in the form of thyristors or silicon controlled rectifiers (SCRs), to control the current flow and, in turn, the terminal voltages of the induction motor.

In general, the soft starter temporarily reduces load and torque in a powertrain of the motor during startup. This reduction allows for reduced stresses on the motor and electrical network, which increases the life of the system. The soft starter or motor drive allows for reducing the voltage or current input to the motor via selective control of the thyristors. A failure of one or more thyristors in the soft starter may lead to system inoperability or to elimination of the soft starting technique for extending the life of the motor.

Detection devices have been designed that generate feedback regarding the amount of current flowing through the soft starter. The feedback may be monitored to determine the power dissipation through the soft starter and may be used to calculate the temperature of the soft starter for heat regulation. A common industrial practice is to measure current using the same principles as a transformer. A magnetic field is induced around a conductor as current is passed through the conductor. This magnetic field may be induced into a magnetic coil looped around the conductor. This method is similar to an air core transformer and is commonly referred to as a current transformer. The amount of magnetically induced current into the coil is dependent on the number of coil loops and the amount of signal current desired. The current signal, therefore, should be proportional to the actual current in the conductor of interest. A scale is developed to read the coupled current signal value in the conductor as an actual current signal.

The output of the current transformer may be used to sense an on-state condition in the soft starter by sensing a high current passing through the conductor, for example. Sensing a high current through the soft starter includes sensing a wide range of current that may pass through the conductor. Often, the sensed current is converted from an analog signal to a digital signal. Sensing and converting such a wide range of current to a digital signal results in a large step size between each digital value. Such a coarse digital step size scale is often adequate to estimate the power flowing through the soft starter. However, it may be desirable to sense the currents flowing through thyristors of the soft starter both in the on state as well as in the off state to more accurately measure the operational status of the soft starter. In this case, the coarse digital step size of the scale set up for wide-range current detection is often too large to provide reliable accurate information for currents flowing through off-state thyristors.

It would therefore be desirable to have a system for more accurately sensing the current flowing through a soft starter.

BRIEF DESCRIPTION OF THE INVENTION

According to one aspect of the invention, a current monitoring system comprises a controller and a current transfer device that includes a first solid state switching device. A first current sensor is coupled to the first solid state switching device and the controller to sense off-state current of the first solid state switching device. The controller is configured to determine operational status of the first solid state switching device based on the off-state current.

According to another aspect of the invention, a current monitoring system comprises a controller and a current transfer device that includes first and second solid state switching devices coupled to one another. A first conductor is coupled to the first solid state switching device to convey a current of the first solid state switching device and a second conductor is coupled to a second solid state switching device to convey a current of the second solid state switching device. A first current sensor senses current of the first solid state switching device and a first current measurement circuit is coupled to the first current sensor and is configured to output a first output value. A first turn-off circuit is coupled to the controller and to the first current measurement circuit. The first turn-off circuit is configured to receive a voltage value from an additional current sensor positioned to measure the current of the first solid state switching device and decouple the first current sensor from the controller if the voltage value received from the additional current sensor is below a threshold. The controller is configured to obtain the first output value from the first current measurement circuit and determine an operability of the first solid state switching device based on the first output value.

According to yet another aspect of the invention, a method of manufacturing a solid state switching device monitor comprises coupling a current transfer device to a first current measurement circuit via a first current sensor. The current transfer device includes a first solid state switching device and a first conductor coupled to the first solid state switching device to convey a first current through the first solid state switching device. The first current includes current through the first solid state switching device when the first solid state switching device is in an off state. A controller is coupled to the first current measurement circuit and the first current measurement circuit is configuring to output a first output value to the controller representative of the first current through the first solid state switching device. The controller is set to determine a state of operability of the first solid state switching device based on the first current and generate an alert if the first current indicates impending inoperability.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
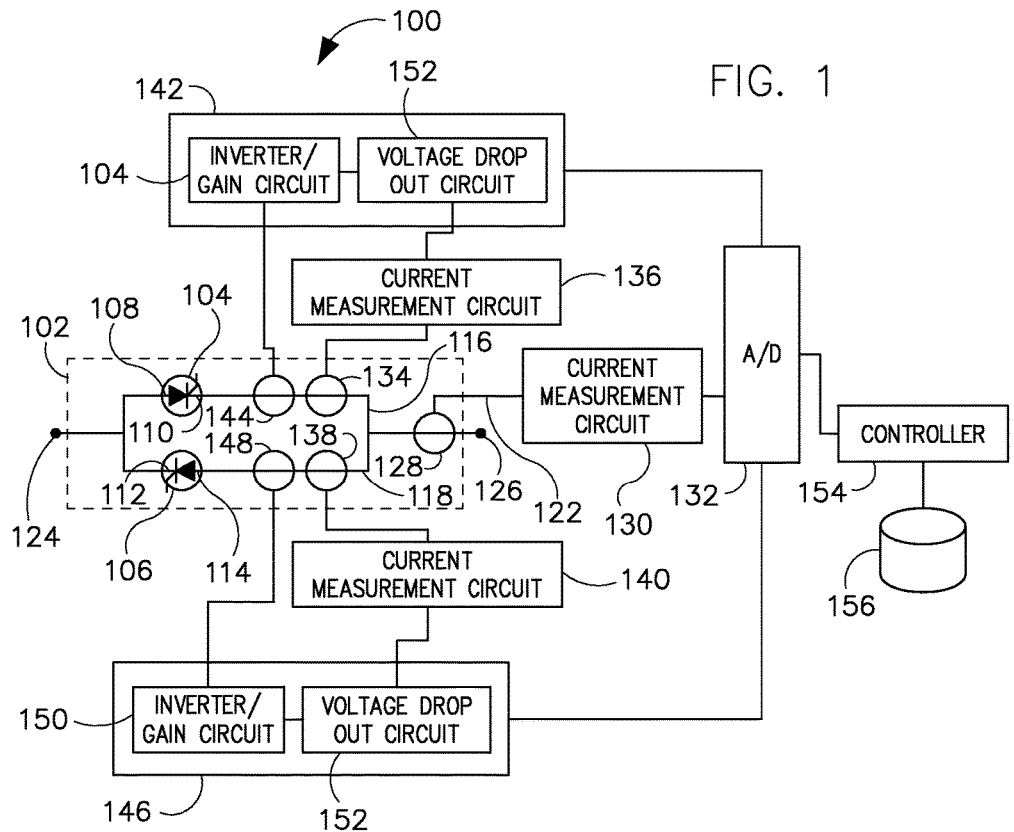
FIG. 1 is a block diagram of a soft starter current monitoring system according to an embodiment of the invention.

FIG. 1 illustrates a block diagram of a soft starter current monitoring system 100 according to an embodiment of the invention. Monitoring system 100 includes a soft starter 102 including a pair of thyristors 104, 106 arranged in an anti- or reverse-parallel arrangement. That is, the anode 108 and cathode 110 of thyristor 104 are respectively coupled to the cathode 112 and anode 114 of thyristor 106. A pair of conductors 116, 118 of soft starter 102 are coupled to a pair of pin conductors 120, 122 to allow current to be supplied to and to flow through pins 124, 126 of soft starter 102.

A current sensing device 128 positioned to sense the current flowing through soft starter 102 in a full SCR soft starter conduction mode is coupled to a current measurement circuit 130 designed to measure current flowing through soft starter 102 when either thyristor 104 or thyristor 106 is in an on state and conducting current therethrough. In one embodiment, current sensing device 128 is a current transformer inductively coupled to pin conductor 122 leading to or from pin 126. Embodiments of the invention, however, contemplate the coupling of current sensing device 128 to pin conductor 120 or to any conductor carrying the current flowing through soft starter 102. Current sensing device 128 is configured to measure a high current flowing through soft starter 102 and thus includes the ability to sense a wide range of current. The measured or sensed current is converted from an analog signal to a digital signal via an A/D converter 132. Sensing and converting such a wide range of current to a digital signal results in a large or coarse step size between each digital value that is not sensitive enough to detect current flowing through an off-state thyristor of soft starter 102.

Accordingly, embodiments of the invention include a current sensing device 134 coupled to an off-state current measurement circuit 136 configured to measure off-state current flowing through thyristor 104 and a current sensing device 138 coupled to an off-state current measurement circuit 140 configured to measure off-state current flowing through thyristor 106. Off-state current measurement circuits 136, 140 are scaled and configured to generate an output voltage representative of the current flowing through thyristors 104, 106 in their off states. Such off-state currents are very small relative to the amount of current able to flow through thyristors 104, 106 in their on states.

Figure 2:
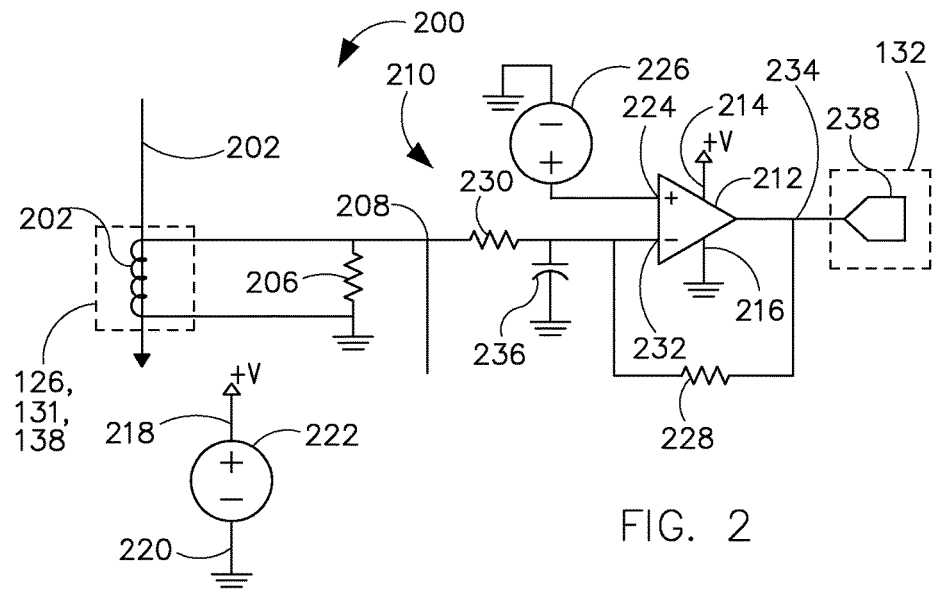
FIG. 2 is a schematic illustration of a current measurement circuit according to an embodiment of the invention.

Referring to FIG. 2, a schematic illustration of a current measurement circuit 200 is shown according to an embodiment of the invention. Current measurement circuit 200 includes an embodiment suitable for circuits 130, 136, or 140 of FIG. 1. Circuit 200 includes a coil 202 looped around a conductor 204 (e.g., conductor 116, 118, or 122 of FIG. 1). In one embodiment, coil 202 has multiple turns looped around conductor 204. Accordingly, a current from soft starter 102 or one of the thyristors 104, 106 in its off state passing through coil 202 along conductor 204 inductively generates a current in coil 202 that is converted to a voltage via current-to-voltage device 206, which is a resistor as shown. The current induced in coil 202 and, hence, the voltage generated across resistor 206 is proportional to the current passing through soft starter 102 or one of the thyristors 104, 106 in its off state along conductor 204. The proportional voltage is available at a node 208 coupled to a scaling circuit 210 and to any other additional scaling circuits (not shown) coupled thereto.

Scaling circuit 210 includes an amplifier 212 having a pair of power terminals 214, 216 electrically coupled to a positive DC voltage bus 218 and to a ground bus 220, respectively. A single, positive DC power supply 222 is coupled between positive DC voltage bus 218 and ground bus 220 and provides single-source power to energize amplifier 212. A positive voltage input 224 of amplifier 212 is configured to receive a first DC offset voltage 226 designed, in one embodiment, based on a combination (e.g., multiplication) of the median of a desired output voltage range of scaling circuit 210 with an inverse of the scaling factor of scaling circuit 210. The scaling factor of scaling circuit 210 may be determined by a pair of resistors 228, 230 coupled to node 208 and between a negative voltage input 232 of amplifier 212 and a scaled voltage output 234 of amplifier 212. Thus, the scaling factor may be tailored to measure the wide range of currents configured to flow through soft starter 102 in its operating state by current measurement circuit 130 or to measure the narrower range of leakage currents flowing through off-state thyristors 104, 106 as needed by current measurement circuits 136, 140. A capacitor 236 is also coupled to negative voltage input 232 and helps provide EMC filtering of the voltage at negative voltage input 232. Off-state current measurement circuit 136 or 140 is coupled to an analog-to-digital converter channel 238 of A/D converter 132 according to an embodiment of the invention.

Referring again to FIG. 1, the scaling factor of current measurement circuits 136, 140 will cause their output voltage to quickly rise to the rail voltage when the respective thyristor 104, 106 is conducting current in an on state. That is, because any off-state currents flowing through thyristors 104, 106 is much less than currents flowing through thyristors 104, 106 during their on states, off-state current measurement circuits 136, 140 generally become quickly saturated when their respective thyristors 104, 106 begin conducting in their on states. Since the rail voltage is not indicative of a leakage current of the thyristor 104, 106 in an off state, a first current measurement turn off circuit 142 is coupled to receive both the output voltage from off-state current measurement circuit 136 and a current measurement from a current sensing device 144 coupled to conductor 116. A second current measurement turn off circuit 146 is coupled to receive both the output voltage from off-state current measurement circuit 140 and a current measurement from a current sensing device 148 coupled to conductor 118. Current sensing devices 144, 148 may be, for example, current transformers. First and second current measurement turn off circuits 142, 146 are configured to cause the output voltage from off-state current measurement circuits 136, 140 to be delivered to A/D converter 132 when the respective thyristor 104 or 106 is in an off state. That is, when either thyristor 104, 106 is in a reverse blocking mode where a higher voltage is applied to its cathode 110, 112 than to its anode 108, 114, a small amount of reverse-bias leakage current flows through the device. An anode-cathode current and a gate leakage current contribute to the current flowing through the device in its off state. This reverse-bias leakage current is measured by off-state current measurement circuits 136, 140 and delivered to A/D converter 132.

To detect thyristor off states, first and second current measurement turn off circuits 142, 146 include an inverter and gain circuit 150 coupled to current sensing devices 144, 148 and to a voltage drop out circuit 152, which is also coupled to respective off-state current measurement circuits 136, 140 and to A/D converter 132.

Figure 3:
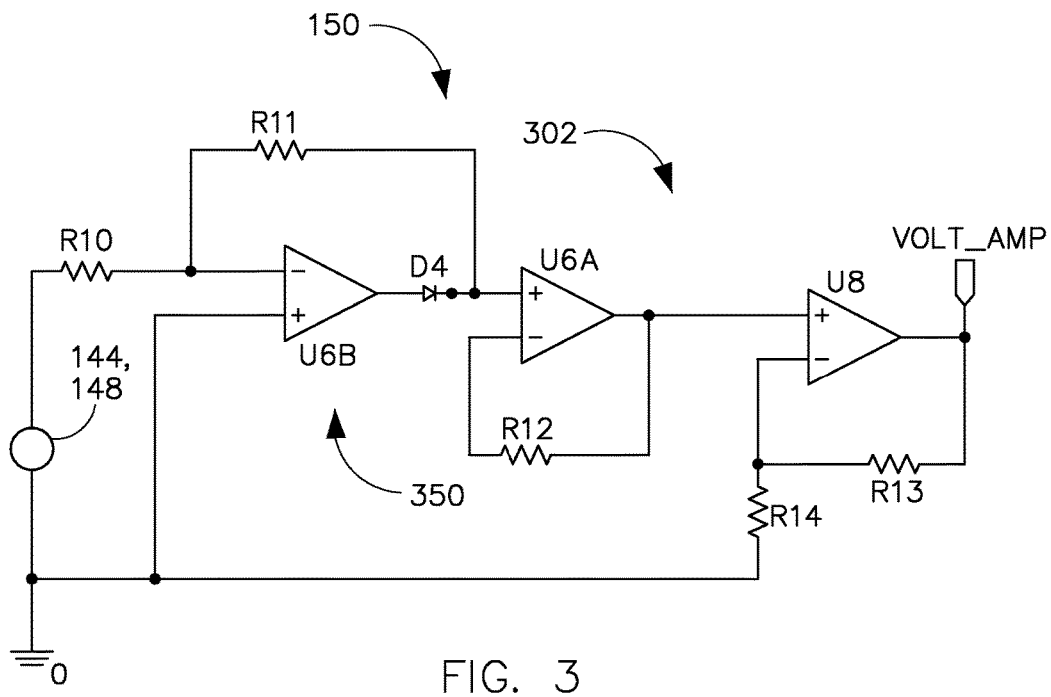
FIG. 3 is a schematic illustration of an inverter/gain circuit according to an embodiment of the invention.
Figure 4:
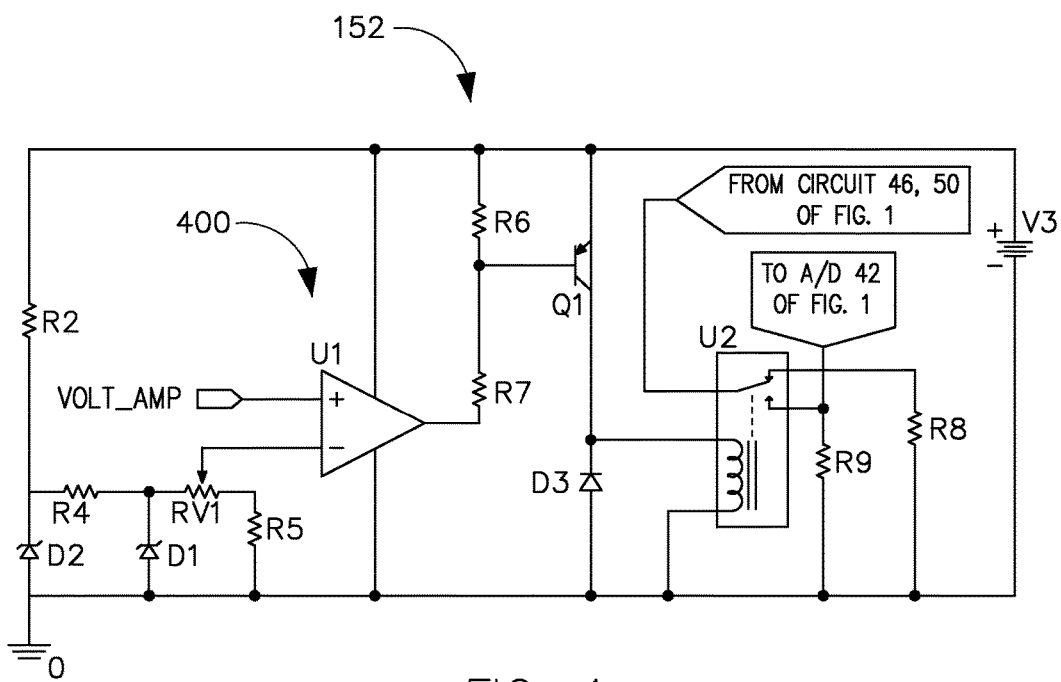
FIG. 4 is a schematic illustration of a voltage drop out circuit according to an embodiment of the invention.

FIGS. 3 and 4 respectively illustrate exemplary embodiments for inverter and gain circuit 150 and voltage drop out circuit 152 of FIG. 1 according to an embodiment of the invention. Inverter and gain circuit 150 receives a voltage from the line voltage and inverts the voltage in an inverter stage 350. In this manner, negative voltages from current sensing device 144 or 148 are inverted to positive voltages and boosted in a gain stage 302 of inverter and gain circuit 150. An output voltage, volt_amp, from gain stage 302 is input into a comparator stage 400 of voltage drop out circuit 152 as illustrated in FIG. 4. A relay 402 driven by the result of comparator stage 400 toggles a connection of A/D converter 132 to off-state current measurement circuit 136 or 140 depending on the result. As illustrated in this embodiment, if the value of volt_amp is below a predetermined threshold, relay 402 decouples A/D converter 132 from off-state current measurement circuit 136 or 140 as illustrated. The value of volt_amp will typically be below the predetermined threshold when the respective thyristor 104, 106 is in an on-state. Alternatively, when the respective thyristor 104, 106 is in an off-state, the value of volt_amp will typically be above the predetermined threshold, and relay 402 will couple A/D converter 132 to off-state current measurement circuit 136 or 140.

Referring back to FIG. 1, a controller 154 is shown coupled to A/D converter 132. It is contemplated, however, that controller 154 may incorporate an A/D converter and that a separate A/D converter as shown may not be incorporated in some embodiments. Controller 154 is configured to receive the digitally-converted current measurements of current measurement/turn off circuits 142, 146 from A/D converter 132. The off-state reverse bias leakage currents measured by circuits 142, 146 allow controller 154 to compare the measured values with expected or rated values specified for the thyristors 104, 106 to determine an operational status thereof. Controller 154 may compare the measured values with values obtained from a lookup table stored in the controller or in a separate database 156. If the leakage current or average leakage current flowing through thyristors 104, 106 falls within the values or range of values allowed for, controller 154 may indicate that the measured thyristor 104, 106 is in an expected working order. However, if the leakage current or average leakage current flowing through thyristors 104, 106 falls outside of the values or range of values allowed for, controller 154 may indicate that the measured thyristor 104, 106 is in an abnormal working state and may indicate a possible impending failure of the affected thyristor. In this case, preventative maintenance of soft starter 102 may be accomplished to ensure that it remains in working order. For example, the affected thyristor may be replaced with a replacement thyristor known to be good. In an embodiment of the invention, an average DC current during the off state or the voltage notch during firing of soft starter 102 taken over a number of cycles can be determined. For example, the average DC current taken over ten cycles may be used.

In addition to checking the measured leakage current against expected values, controller 154 may use the measured leakage current together with the measured current on pin conductor 122 to calculate a more-accurate power dissipation through soft starter 102 than using the measured current on pin conductor 122 alone. That is, given the difference in the magnitude of the currents on conductors 116, 118 when one thyristor (e.g., thyristor 104) is in an on state and when the other thyristor (e.g., thyristor 106) is in an off state, the scale of the measured current on pin conductor 122 may mask the leakage current through the off-state thyristor (e.g., thyristor 106) and may thus inaccurately represent the total power dissipated by soft starter 102. However, using the measured currents from both pin conductor 122 and the off-state thyristor (e.g., thyristor 106) allows the power dissipation through soft starter 102 to be more accurately represented such that a temperature of soft starter 102 may be determined or calculated by controller 154 to determine whether the temperature is outside of expected or rated temperature values of soft starter 102 in an operating mode. If the calculated temperature or an average temperature is outside of the values or range of values allowed for, controller 154 may indicate that soft starter 102 is in an abnormal working state and may indicate a failure mode of soft starter 102 or may indicate that a possible failure of soft starter 102 is impending. In addition, controller 154 may provide the power dissipation and/or calculated temperature of soft starter 102 in its working state to assist in the determination of an appropriate heat sink to handle the heat transfer therefrom. In an embodiment of the invention, an average soft starter power dissipation may be calculated based on a sum of the averages of soft starter off state power and soft starter on state power.

Therefore, according to one embodiment of the invention, a current monitoring system includes a controller and a current transfer device having a first solid state switching device. A first current sensor is coupled to the first solid state switching device and the controller to sense off-state current of the first solid state switching device. The controller is configured to determine operational status of the first solid state switching device based on the off-state current.

According to another embodiment of the invention, a current monitoring system comprises a controller and a current transfer device that includes first and second solid state switching devices coupled to one another. A first conductor is coupled to the first solid state switching device to convey a current of the first solid state switching device and a second conductor is coupled to a second solid state switching device to convey a current of the second solid state switching device. A first current sensor senses current of the first solid state switching device and a first current measurement circuit is coupled to the first current sensor and is configured to output a first output value. A first turn-off circuit is coupled to the controller and to the first current measurement circuit. The first turn-off circuit is configured to receive a voltage value from an additional current sensor positioned to measure the current of the first solid state switching device and decouple the first current sensor from the controller if the voltage value received from the additional current sensor is below a threshold. The controller is configured to obtain the first output value from the first current measurement circuit and determine an operability of the first solid state switching device based on the first output value.

According to yet another embodiment of the invention, a method of manufacturing a solid state switching device monitor includes coupling a current transfer device to a first current measurement circuit via a first current sensor. The current transfer device includes a first solid state switching device and a first conductor coupled to the first solid state switching device to convey a first current through the first solid state switching device. The first current includes current through the first solid state switching device when the first solid state switching device is in an off state. A controller is coupled to the first current measurement circuit and the first current measurement circuit is configuring to output a first output value to the controller representative of the first current through the first solid state switching device. The controller is set to determine a state of operability of the first solid state switching device based on the first current and generate an alert if the first current indicates impending inoperability.

Embodiments of the present invention have been described in terms of the preferred embodiment, and it is recognized that equivalents, alternatives, and modifications, aside from those expressly stated, are possible and within the scope of the appending claims.

What is claimed is:

1. A current monitoring system comprising:
    a controller;
    a current transfer device comprising:
       a first solid state switching device; and
       a first current sensor coupled to the first solid state switching device and the controller to sense off-state current of the first solid state switching device; and
    wherein the controller is configured to determine operational status of the first solid state switching device based on the off-state current.

2. The current monitoring system of claim 1 wherein the controller creates an alert if the off-state current indicates an impending inoperability of the first solid state switching device.

3. The current monitoring system of claim 1 further comprising a first current measurement circuit coupled between the first current sensor and the controller and configured to output a first output value to the controller representative of the off-state current of the first solid state switching device.

4. The current monitoring system of claim 1 wherein the off-state current comprises current flowing through the first solid state switching device when the first solid state switching device is in an off state.

5. The current monitoring system of claim 1 wherein the current transfer device further comprises:
    a second solid state switching device coupled in an anti-parallel arrangement with the first solid state switching device; and
    a second current sensor coupled to the second solid state switching device and the controller to sense off-state current of the second solid state switching device;
    wherein the controller is further configured to:
    determine operational status of the first and second solid state switching devices based on the off-state current.

6. The current monitoring system of claim 5 wherein the current transfer device further comprises a third current sensor coupled to the first and second solid state switching devices to sense on-state current therethrough;
    wherein the controller is further configured to calculate average power based on the off-state and the on-state currents.

7. The current monitoring system of claim 5 wherein the first and second solid state switching devices each comprise a thyristor.

8. The current monitoring system of claim 1 further comprising:
    a second current sensor configured to sense off-state current;
    a first turn-off circuit coupled to the controller and to the first current sensor, wherein the turn-off circuit is configured to:
       decouple the first current sensor from the controller if an output of the second current sensor is below the threshold.

9. The current monitoring system of claim 8 wherein the first turn-off circuit comprises:
    an inverter and gain circuit configured to invert and boost a voltage from the second current sensor;
    a voltage drop out circuit configured to:
       compare the inverted and boosted voltage from the inverter and gain circuit with a voltage threshold;
       couple the first current sensor to the controller if the inverted and boosted voltage is greater than the voltage threshold; and
       decouple the first current sensor from the controller if the inverted and boosted voltage is less than the voltage threshold.

10. The current monitoring system of claim 1 wherein the controller is configured to:
    compare a value of off-state current with a reference value stored in a lookup table; and
    create an alert if the first of the off-state current is greater than the reference value.

11. A current monitoring system comprising:
    a controller;
    a current transfer device comprising first and second solid state switching devices coupled to one another;
    a first conductor coupled to the first solid state switching device to convey a current of the first solid state switching device;
    a second conductor coupled to a second solid state switching device to convey a current of the second solid state switching device;
    a first current sensor configured to sense current of the first solid state switching device;
    a first current measurement circuit coupled to the first current sensor and configured to output a first output value;
    a first turn-off circuit coupled to the controller and to the first current measurement circuit, wherein the first turn-off circuit is configured to:
       receive a voltage value from an additional current sensor positioned to measure the current of the first solid state switching device; and
       decouple the first current sensor from the controller if the voltage value received from the additional current sensor is below a threshold; and
    wherein the controller is configured to:
       obtain the first output value from the first current measurement circuit;
       determine an operability of the first solid state switching device based on the first output value.

12. The current monitoring system of claim 11 further comprising:
    a second current sensor configured to sense current of the second solid state switching device;
    a second current measurement circuit coupled to the second current sensor and configured to output a second output value;
    a second turn-off circuit coupled to the controller and to the second current measurement circuit, wherein the second turn-off circuit is configured to:

receive a voltage value from an additional current sensor associated with the second conductor to measure current of the second solid state switching device; and decouple the second current sensor from the controller if the voltage value received from the additional current sensor associated with the second conductor is below a threshold.

13. The current monitoring system of claim 12 further comprising:

a third current sensor coupled to the first and second conductors;

a third current measurement circuit coupled to the controller and to the third current sensor;

wherein the controller is further configured to calculate an average power flowing through the current transfer device based on an output of the first, second and third current measurement circuit values.

14. The current monitoring system of claim 11 wherein the first and second solid sate switching devices are thyristers and wherein the controller creates an alert if the first output value is outside a predetermined range.

15. The current monitoring system of claim 11 wherein the first current sensor comprises a current transformer.

16. The current monitoring system of claim 11 wherein the first current sensor senses current inductively.

17. A method of manufacturing a solid state switching device monitor comprising:

coupling a current transfer device to a first current measurement circuit via a first current sensor, wherein the current transfer device comprises:

a first solid state switching device; and a first conductor coupled to the first solid state switching device to convey a first current through the first solid state switching device, wherein the first current comprises current through the first solid state switching device when the first solid state switching device is in an off state;

coupling a controller to the first current measurement circuit;

configuring the first current measurement circuit to output a first output value to the controller representative of the first current through the first solid state switching device; and configuring the controller to:

determine a state of operability of the first solid state switching device based on the first current; and generate an alert if the first current indicates impending inoperability.

18. The method of claim 17 further comprising:

coupling a second current sensor configured to sense the first current;

coupling a turn-off circuit to the controller and to the first current measurement circuit and configuring the turn-off circuit to:

couple the first output value to the controller if the first solid state switching device is in an off state; and decouple the first output value from the controller if the first solid state switching device is in an on state.

19. The method of claim 18 wherein coupling the turn-off circuit to the controller and to the first current measurement circuit comprises:

coupling an inverter and gain circuit to the second current sensor;

configuring the inverter and gain circuit to invert and boost a voltage from the second current sensor;

coupling a voltage drop out circuit to the controller and to the first current measurement circuit; and configuring the voltage drop out circuit to:

compare the inverted and boosted voltage from the inverter and gain circuit with a voltage threshold;

couple the first output value to the controller if the inverted and boosted voltage is greater than the voltage threshold; and decouple the first output value from the controller if the inverted and boosted voltage is lesser than the voltage threshold.

20. The method of claim 17 further comprising:

coupling the current transfer device to a second current measurement circuit via a second current sensor, wherein the current transfer device comprises:

a second solid state switching device; and a second conductor coupled to the second solid state switching device to convey a second current through the second solid state switching device, wherein the second current comprises current through the second solid state switching device when the second solid state switching device is in an off state;

coupling the controller to the second current measurement circuit; and configuring the second current measurement circuit to output a second output value to the controller representative of the second current flowing through the second solid state switching device.

* * * * *